(12) United States Patent
Ziglioli et al.

(10) Patent No.: US 8,411,457 B2
(45) Date of Patent: Apr. 2, 2013

(54) SEMICONDUCTOR PACKAGE SUBSTRATE

(75) Inventors: Federico Ziglioli, Gessate (IT);
Giovanni Graziosi, Carnate (IT); Mario Cortese, Milan (IT)

(73) Assignee: STMIcroelectronics S.r.l., Agrate Brianza (IT)

( * ) Notice: Subject to any disclaimer, the term of this patent is extended or adjusted under 35 U.S.C. 154(b) by 284 days.

(21) Appl. No.: 12/615,921

(22) Filed: Nov. 10, 2009

(65) Prior Publication Data
US 2010/0052144 A1 Mar. 4, 2010

Related U.S. Application Data

(63) Continuation of application No. 11/581,216, filed on Oct. 13, 2006, now Pat. No. 7,616,451.

(51) Int. Cl.
*H05K 7/02* (2006.01)
*H05K 7/06* (2006.01)
*H05K 7/08* (2006.01)
*H05K 7/10* (2006.01)

(52) U.S. Cl. ......... 361/779; 361/764; 361/782; 361/784

(58) Field of Classification Search .......... 361/792–795; 174/250–261; 257/720–730
See application file for complete search history.

(56) References Cited

U.S. PATENT DOCUMENTS

| | | | |
|---|---|---|---|
| 5,900,674 A | 5/1999 | Wojnarowski et al. | |
| 6,333,857 B1 * | 12/2001 | Kanbe et al. | 361/792 |
| 6,521,530 B2 | 2/2003 | Peters et al. | |
| 6,723,583 B2 | 4/2004 | Takahashi et al. | |
| 7,616,451 B2 | 11/2009 | Ziglioli et al. | |
| 2005/0006744 A1 * | 1/2005 | Ooi et al. | 257/686 |
| 2006/0001179 A1 * | 1/2006 | Fukase et al. | 257/778 |

* cited by examiner

*Primary Examiner* — Tuan T Dinh
(74) *Attorney, Agent, or Firm* — Graybeal Jackson LLP

(57) ABSTRACT

A semiconductor package substrate suitable for supporting a damage-sensitive device, including a substrate core having a first and opposite surface; at least one pair of metal layers covering the first and opposite surfaces of the package substrate core, which define first and opposite metal layer groups, at least one of said layer groups including at least one metal support zone; one pair of solder mask layers covering the outermost metal layers of the at least one pair of metal layers; and a plurality of routing lines; wherein the at least one metal support zone is formed so that it lies beneath at least one side of the base of the damage-sensitive device and so as to occupy a substantial portion of the area beneath the damage-sensitive device which is free of said routing lines; a method for the production of such substrate is also described.

14 Claims, 13 Drawing Sheets

SEMICONDUCTOR PACKAGE SUBSTRATE

PRIORITY CLAIM

The present application is a Continuation of copending U.S. patent application Ser. No. 11/581,216, filed Oct. 13, 2006, which application is incorporated herein by reference in its entirety.

TECHNICAL FIELD

Embodiments generally relate to a semiconductor package substrate and manufacturing methods thereof.

More in particular, but not exclusively, embodiments relate to a land grid array (LGA) and ball grid array (BGA) semiconductor package substrate supporting a micro-electro-mechanical system (MEMS) device, and the following description is made with reference to such a specific technical field for the sole purpose of simplifying the present disclosure.

BACKGROUND

As it is well known, a micro-electro-mechanical system (MEMS) device is a microdevice that integrates mechanical and electrical functions in a silicon chip realized using lithographic microfabrication techniques.

The final assembled device or chip is typically composed of a MEMS die and optionally application-specific integrated circuits (ASICs) assembled on top of a substrate both in side by side or stacked configuration, using standard assembly processes.

In fact, it is well known that integrated circuits (IC) are fabricated on the surface of a semiconductor wafer and later singulated into individual semiconductor devices, which may be referred to as a "die" or "dice" herein. Since the material of a semiconductor wafer—commonly silicon—tends to be relatively fragile and brittle, dice are usually assembled into protective housings, or "packages," before being interconnected with a printed circuit board (PCB), the package ensuring the interconnection between the dice and the board.

The semiconductor device is normally encapsulated within a protecting material (normally epoxy resin), or cap or other molding compound, to ensure electrical and mechanical protection, in general, as well as to protect against moisture, dust, and other external agents.

In the case where more than one die is required, the semiconductor devices (e.g. MEMS) can be found in a variety of relations with respect to each other, depending on the type of stacking configuration that applies. The devices can thus be found to be in the side by side, stacked, inversely stacked, or other conformation.

The LGA/BGA substrate is covered with patterns, or traces, of conductive material layers (usually copper), that are insulated from one another by alternating layers of insulating or dielectric material. Conductive traces are also separated within each layer by an insulating, or dielectric, material.

Conductive tunnels, called "vias", typically pass through insulating layers according to a vertical orientation with respect to the layers, to form conductive pathways between adjacent conductive patterns, thus providing the electrical connection between the metal layers provided on the dice. Such vias are required in the package substrate of a die or a MEMS device to insure the correct signal transmission between different metal layers.

Commonly used in the field are land grid array (LGA) packages wherein one or more dice are mounted on a package substrate and enclosed in a homogenous material molding compound.

The LGA package is so named because the package substrate has an array of electrical contact pads, or "lands," arranged in a grid pattern on its underside. The lands are coupled with the printed circuit board (PCB) generally with solder material. The PCB is substantially a support board for mounting the LGA/BGA packages.

LGA packages are highly desirable in those cases where size reduction, performance and cost issues are of particular concern.

The upper surface of the package substrate is surmounted by a silicon die, for example a MEMS device, which can be coupled to pads or to bond fingers on the top metal layer of the LGA by wire-bonding. Normally, the die is attached to the substrate with the aid of an adhesive material such as a glue or a tape.

It is thus clear that, as well as constituting the mechanical support of the die or MEMS device, the package substrate also has a fundamental role from the electrical point of view.

A standard package substrate is schematically shown in FIG. 1, globally indicated with 10.

The substrate 10 is made of a polymeric material (for example, bismaleimide and triazine (BT) resin) core 4 and comprises a pair of metal layers 3a, 3b consisting of a top metal layer 3a and a bottom metal layer 3b each consisting of a first sub-layer surrounding the core 4 (copper foil) and a second sub-layer (copper plating) overlying the first sub-layer. The pair of metal layers 3a, 3b is in turn surrounded by a top 1a and a bottom 1b solder mask layer.

The number of metal layers that can be used in the composition of package substrates 10 is variable and typically ranges between 2 and 4.

For a two-layer LGA/BGA substrate, standard thickness values are in the range of 200 to 300 μm, wherein the core is approximately 100 μm or 200 μm, each copper layer is 12-28 μm, and each solder mask layer is approximately 25 μm in thickness.

In the example shown in FIG. 1, vias 8 are realized by plated through holes, or PTH, drilled in the core 4 to provide electrical connections between the two copper layers 3a and 3b. Typical dimensions of drill are in the range of 100 to 200 μm in diameter.

Along the production line of, for example, a MEMS device, the assembly of the package can represent quite a critical step for such a sensitive electronic device. The package, in fact, can undergo considerable mechanical stress during manufacturing, especially during the molding step, which can lead to tilting of the die and failure by delamination of its cap, with consequent loss of the sealing effect, which in turn affects the durability of the device as well as its quality of performance, in terms of offset stability and drift of the package, upon use.

During the assembly steps, under considerable thermal stress conditions, the substrate strip where the dice are mounted on can undergo warpage, which results in high stress conditions for the mounted dice.

To overcome some of these problems, it is known to balance the superficial distribution of the patterned copper layers by inserting copper meshes.

Other known solutions comprise package substrates having an increased thickness in order to enhance their tolerance to the production processes usually employed in the field. In this case, however, the total thickness of the package is also increased, which is undesirable, for obvious reasons.

However, in the case of devices that are especially sensitive to the mechanical and thermal stresses of the assembly step, in particular the molding step, such as the MEMS devices, such known solutions are not always sufficient to insure effective balancing and mechanical stability, and an optimal final packaged device.

The problem underlying embodiments is thus that of providing a package substrate overcoming the above-mentioned limitations of the prior art, and which is thus capable of withstanding the mechanical and thermal stresses of the assembly process, in particular of the molding step, and a method of production thereof.

SUMMARY

According to an embodiment, there is provided a semiconductor package substrate suitable for supporting a damage-sensitive device, comprising:
  a) a package substrate core having a first, or upper, and an opposite, or lower, surface, wherein the first, or upper, surface is surmounted by the damage-sensitive device having a base;
  b) at least one pair of metal layers covering the upper and lower surfaces of the substrate core, which define respectively a first, or upper, metal layer group comprising at least one metal layer and an opposite, or lower, metal layer group comprising at least one metal layer, at least one of the layer groups comprising at least one metal support zone;
  c) one pair of solder mask layers covering the outermost metal layers of the at least one pair of metal layers; and
  d) a plurality of routing lines;
wherein the at least one metal support zone is formed so that it lies beneath at least one side of the base of the damage-sensitive device and so as to occupy a substantial portion of the area beneath the base of the damage-sensitive device which is free of the routing lines.

According to another embodiment, there is provided a method for the production of a semiconductor package substrate suitable for supporting a damage-sensitive device having a base, comprising the steps of:
  a) providing a package substrate core having a first, or upper, and an opposite, or lower, surface, the first, or upper, surface to be surmounted by the damage-sensitive device;
  b) preparing at least one pair of metal layers, at least one of the layers comprising at least one support zone and routing lines formed therein; and
  c) depositing the at least one pair of metal layers on the upper and lower surfaces of the package substrate core thus defining respectively a first or upper metal layer group comprising at least one metal layer and an opposite, or lower, metal layer group comprising at least one metal layer; and
  d) depositing one pair of solder mask layers on the outermost layers of the at least one pair of metal layers;
wherein the step of preparing the at least one pair of metal layers forms the at least one metal support zone so as to lie beneath at least one side of the base of the damage-sensitive device and so as to occupy a substantial portion of the area beneath the base of the damage-sensitive device which is free of the routing lines.

It has been found, in fact, that by forming metal support zone patterns according to embodiments, the package substrate is considerably more balanced throughout the manufacturing assembly steps, so that the device is less exposed to delamination, warpage, and the mechanical and thermal stresses which cause loss in performance quality and durability.

Moreover, by forming metal support zone patterns according to embodiments, the package substrate is considerably more mechanically stable, and less susceptible to the tilting of the die, which would cause a reduction in performance quality and durability.

Further features and advantages of package substrates and methods according to embodiments will appear clearer from the description that follows and from the preferred embodiments here provided for illustrative and non-limiting purposes with reference to the figures below.

DETAILED DESCRIPTION

Figure 1:
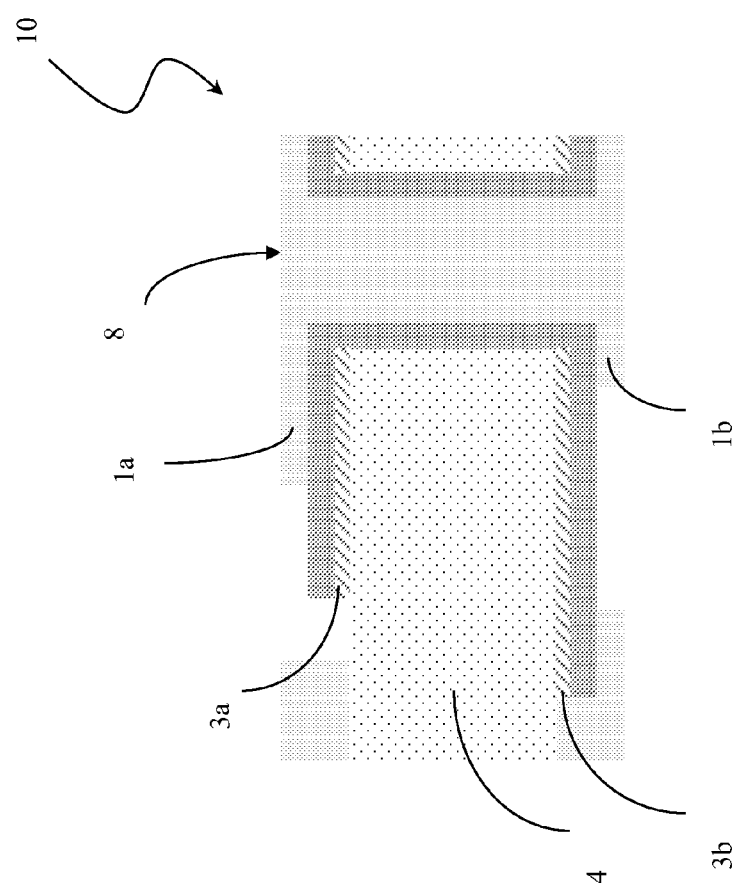
FIG. 1 is a schematic cross section of a package substrate according to the prior art.

The following discussion is presented to enable a person skilled in the art to make and use the subject matter of the present disclosure. Various modifications to the embodiments will be readily apparent to those skilled in the art, and the generic principles herein may be applied to other embodiments and applications without departing from the spirit and scope of the present disclosure. Thus, the present disclosure is not intended to be limited to the embodiments shown, but is to be accorded the widest scope consistent with the principles and features disclosed herein.

With reference to such figures, and in particular with reference to FIGS. 2 to 4, a package substrate according to an embodiment, referred to in its entirety by reference number 20, will now be described in greater detail also by means of two representative examples shown in FIGS. 3 and 4, concerning package substrates intended to support damage-sensitive devices, such as MEMS devices.

Features of embodiments that are functionally or structurally similar or equivalent to those of the prior art will be indicated by the same reference numerals, increased by 10.

The semiconductor package substrate 20 according to an embodiment thus comprises a core 14 made of a polymeric material (for example, BT resin) as according to conventional techniques in the field. The core 14 comprises a first, or upper, surface 14a and an opposite, or lower, surface 14b. A pair of metal layers 13a, 13b, consisting of a first, or upper, metal layer 13a and an opposite, or lower, metal layer 13b, surround the core and may in turn be covered by further metal layer pairs up to a total of four metal layers. Each metal layer consists of a first copper foil sub-layer and a second copper plating sub-layer. The outermost pairs of metal layers are then in turn surrounded by a first, or upper, 11a and opposite, or lower, 11b solder mask layer.

Therefore, the at least one pair of metal layers 13a, 13b are arranged, respectively, on each opposite surface 14a, 14b of the core 14, thus defining two groups of metal layers, namely a first, or upper, metal layer group 17a and an opposite, or lower, metal layer group 17b, each comprising at least one metal layer 13a, 13b.

Prior to their deposition on the core 14, said at least one pair of metal layers 13a 13b are prepared by forming, on at least one of said metal layers, at least one metal support zone 15a, 15b and routing lines 24, so that the metal support zone(s) 15a, 15b lie beneath at least one side of the base 12 of the damage-sensitive device 21 and so as to occupy a substantial portion of the area beneath the base 12 of the damage-sensitive device 21 which is free of routing lines 24. The at least one pair of metal layers 13a, 13b are then deposited on the upper 14a and lower 14b surfaces of the package substrate core 14.

According to embodiments, in fact, by arranging the one or more metal support zones so that a substantial area and at least one side of the base of the damage-sensitive device is well supported from beneath, any tilting on the part of the die is prevented.

According to another embodiment, the at least one metal support zone 15a, 15b, is arranged so as to lie beneath at least three sides of the base 12 of the damage-sensitive device 21.

By positioning the support zone beneath the device at least at three sides of the base 12 thereof, in fact, there is a considerable reduction in the risk of die tilting, which in turn would cause instability of the device and glassfrit delamination due to excess stress generated in the assembling phases.

Advantageously, at least the upper metal layer group 17a is formed so that the space beneath the base 12 of the damage-sensitive device 21 which is free of the routing 24 and of the support zone(s) 15a, 15b does not have an area larger than 0.2 mm$^2$.

Preferably, the upper and lower metal layer groups 17a, 17b, are formed so that the space beneath the base 12 of the damage-sensitive device 21 which is free of the routing 24 and of the support zone(s) 15a, 15b does not have an area larger than 0.2 mm$^2$.

According to another embodiment, the at least one metal support zone 15a, 15b, may be arranged so as to occupy a substantial portion of the area beneath a pad area 23 of the damage-sensitive device 21.

It is worth noting, in fact, that the pad area 23 is a critical portion of a package comprising a semiconductor device 21, the risk of delamination of the cap 22 being extremely high in this portion.

Advantageously, according to this embodiment, the metal support zone(s) 15a, 15b is/are thus arranged in order to insure an effective supporting of the critical portion corresponding to the pad area 23.

According to another embodiment, the metal support zone (s) 15a, 15b, is/are positioned so as to substantially take up all the area beneath the base 12 of the damage-sensitive device which is free of the routing lines 24.

The at least one metal support zone 15a, 15b, may be associated with the upper metal layer group 17a, the lower metal layer group 17b, or both. Each metal layer group 17a and 17b may be associated with one or a plurality of such metal support zones 15a, 15b.

According to one embodiment, the package substrate 20 exhibits at least one metal support zone 15a, associated with the upper metal layer group 17a, whereas the lower metal layer group 17b lacks a metal support zone.

According to another embodiment, the package substrate 20 exhibits at least one metal support zone 15a, 15b in each metal layer group 17a, 17b.

A plurality of vias 18 is then formed through the semiconductor package substrate 20 so that the core 14, and the metal covering layers 13a, 13b are perforated throughout. In particular, the vias 18 are preferably provided as plated through holes, or PTH. Vias may also be realized by the vias in pad (VIP) method, by which the via is directly placed on the lands of the LGA substrate. VIPs are usually drilled and copper plated, and then filled with a solder mask.

The metal layers 13a, 13b may be in copper (Cu), with a finishing in NiAu, and the number of metal layers, which is always an even number, can range from 2 to 4, preferably 2.

The metal support zones 15a, 15, are preferably made of copper (Cu).

The metal support zones 15a, 15b, are formed in their respective metal layers by means of conventional techniques known in the field.

Figure 3:
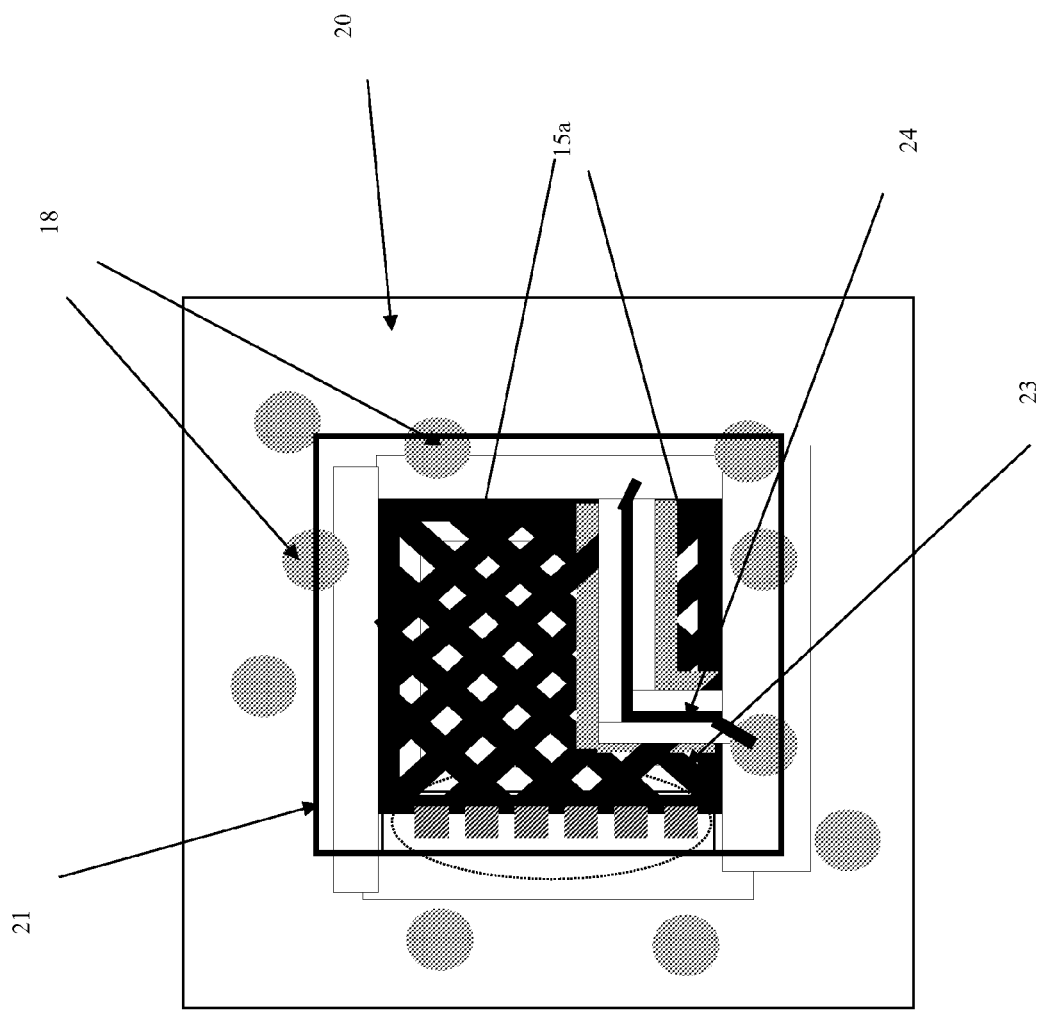
FIG. 3 is a schematic top view representation of a package substrate according to an embodiment.
Figure 4:
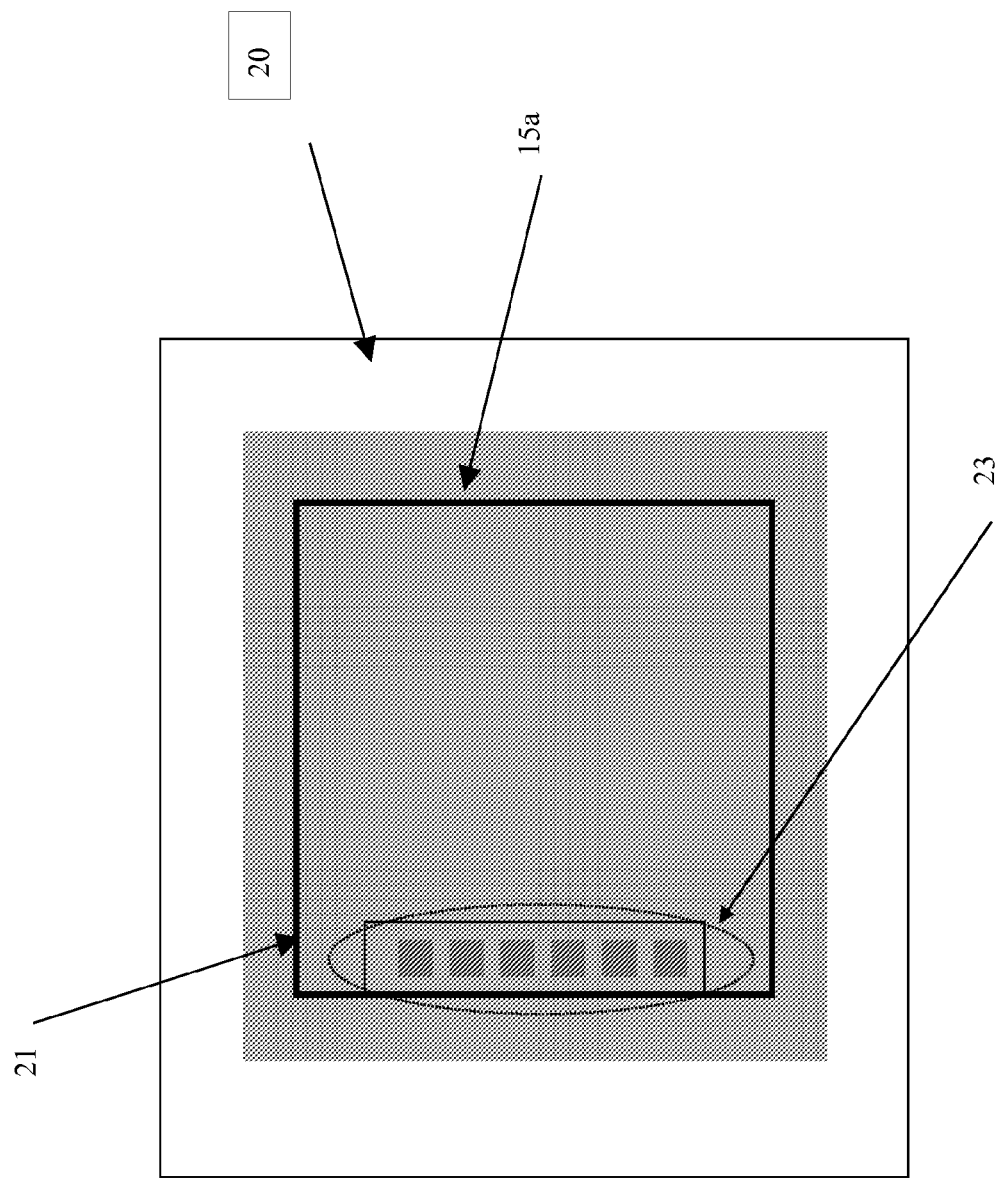
FIG. 4 is a schematic top view representation of a package substrate according to another embodiment.

The metal support zones 15a, 15b, of this embodiment are preferably in the form of a copper mesh as shown in FIG. 3, or in the form of a die pad, which can extend in surface area to consist of a layer covering the entire area beneath the base 12 of the MEMS, as shown in FIG. 4, or a combination of the two.

Typical copper meshes according to embodiments consist of approximately 100 μm wide tracks and exhibit a pitch variable between 300 μm and 500 μm. According to a preferred embodiment, the width is 100 μm and the pitch is 300 μm.

The die pad of embodiments consists of an area of the upper metal group 17a, which consists of a continuous copper zone, without gaps.

The metal support zones 15a, 15b, of embodiments may thus exhibit different sizes, shapes, patterns and arrangements according to the needs and requirements. In order to avoid the tilting of the die, it is a requirement that the die be uniformly supported from beneath it by metal support zone(s) 15a, 15b, vias 18, routing lines 24 or a combination thereof, without any substantial gaps.

In those cases where the metal support zone consists of a mesh, such mesh is oriented in such a way that the mesh tracks run across the metal layer in a direction that is angled by substantially 45° with respect to the sides of the substrate.

Figure 5:
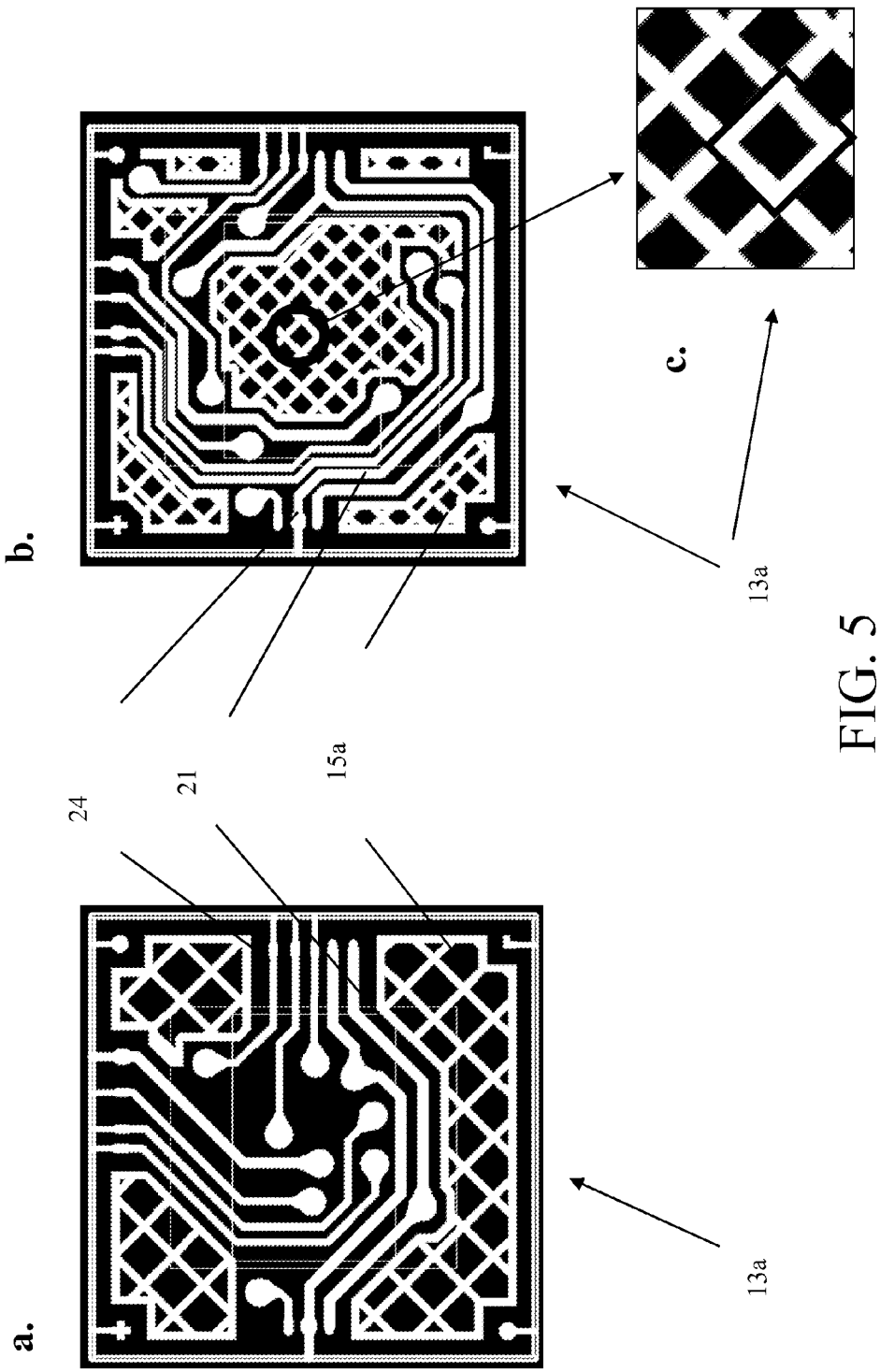
FIGS. 5a and 5b are schematic representations of examples of an upper metal layer having meshes formed therein.
FIG. 5c is an enlarged detail of a feature of FIG. 5b.

FIG. 5a shows an example of an upper metal layer 13a having meshes 15a formed therein, wherein the pitch of the mesh is 500 μm; FIG. 5b shows an example of an upper metal layer 13a having meshes 15a formed therein, wherein the pitch of the mesh is 300 μm. FIG. 5c is an enlarged detail of a feature of FIG. 5b showing that the squared area is 0.16-0.2 mm$^2$.

Figure 6:
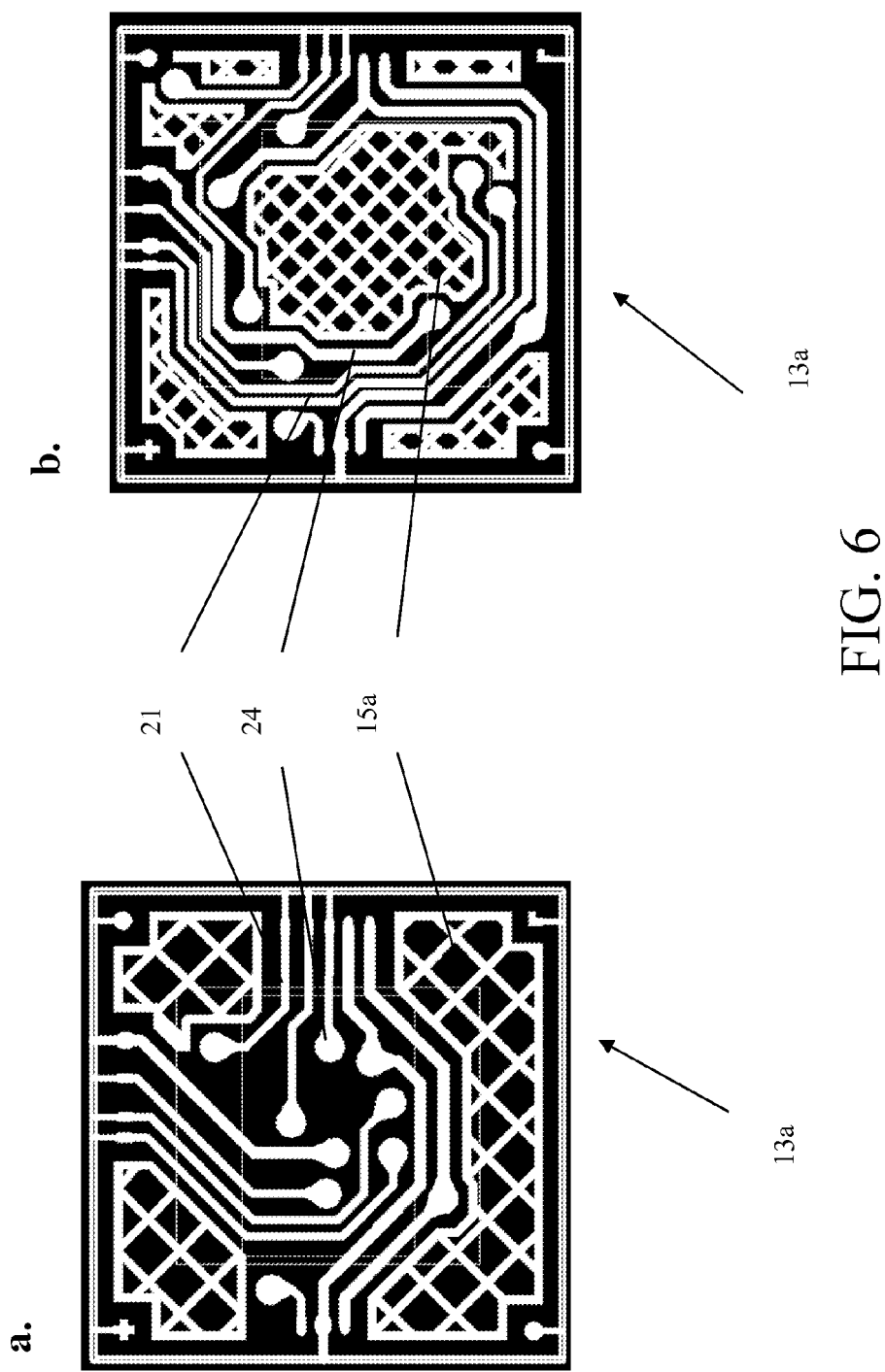
FIGS. 6a and 6b are schematic representations of examples of an upper metal layer having meshes formed therein, according to a non-optimal and a satisfactory fashion, respectively.

FIG. 6a shows an example of an upper metal layer 13a having meshes formed therein according to a non-optimal fashion. The lack of a proper die support is bound to lead to delamination of the damage-sensitive device mounted thereon. FIG. 6b, on the other hand, shows an upper metal layer 13a which has meshes 15a formed therein in such a way that proper support to the damage-sensitive device is ensured.

Figure 7:
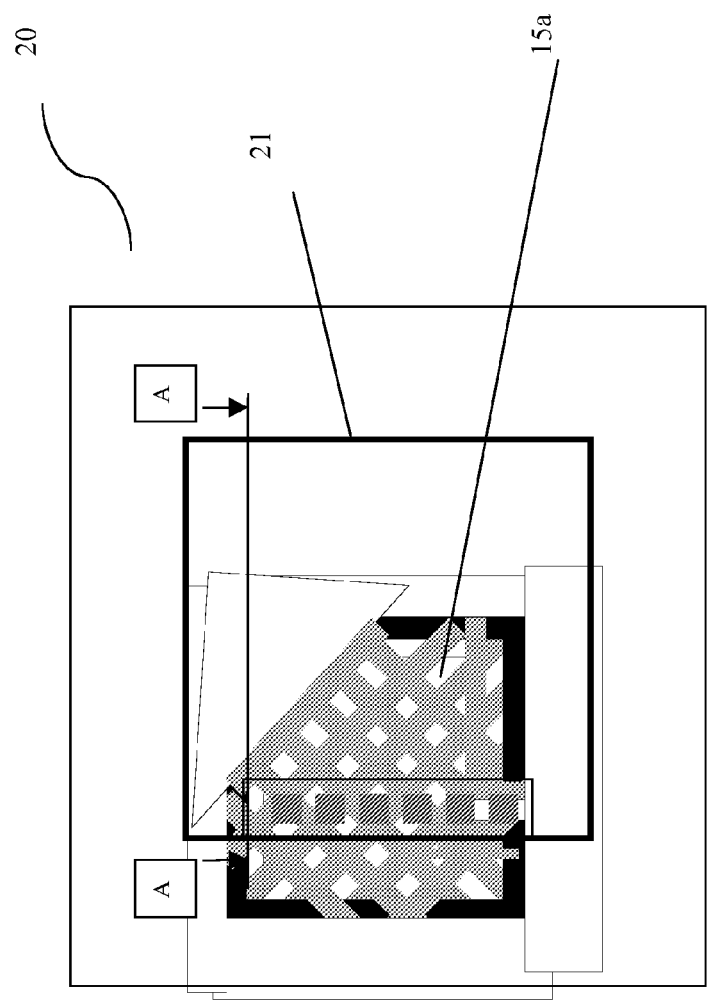
FIG. 7 is a schematic top view representation of a package substrate including a metal support zone only partially positioned in the upper metal layer.
Figure 8:
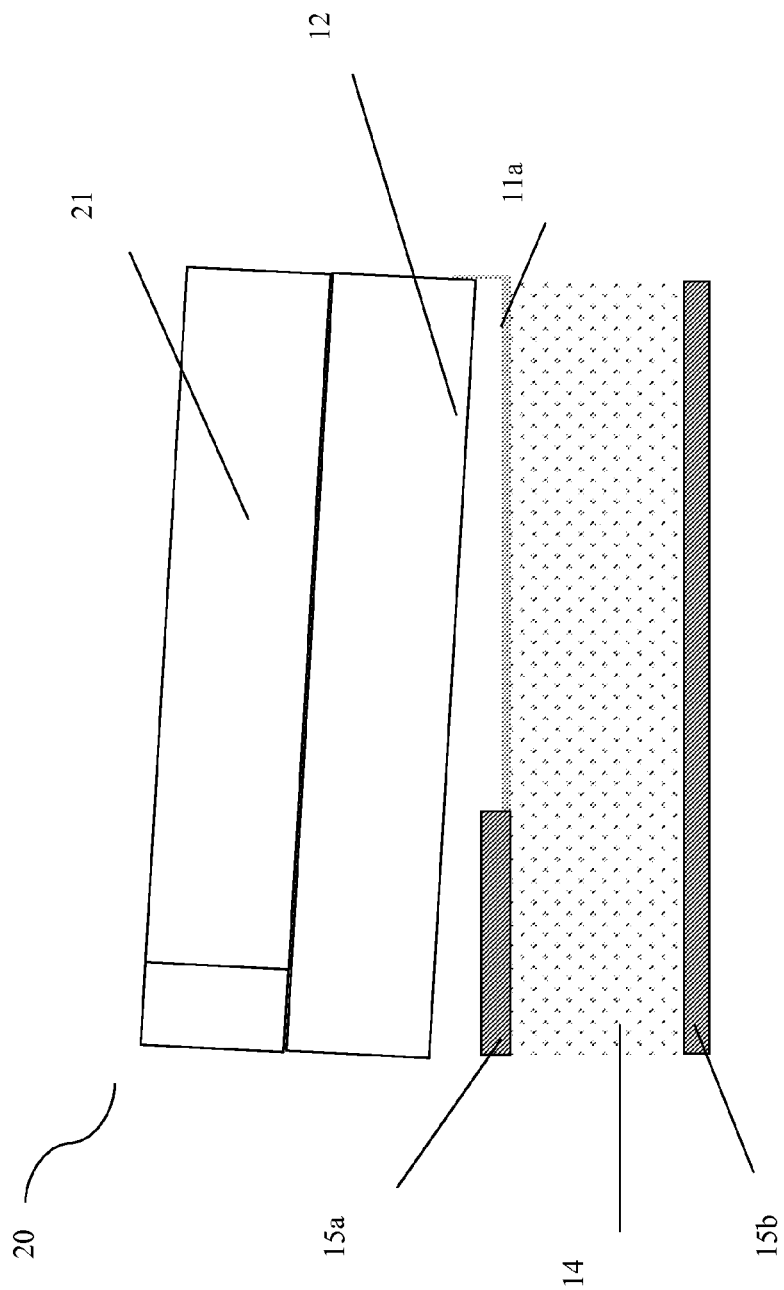
FIG. 8 is a schematic section view of the package substrate of FIG. 5 cut along the line A-A, showing tilting of the device.
Figure 9:
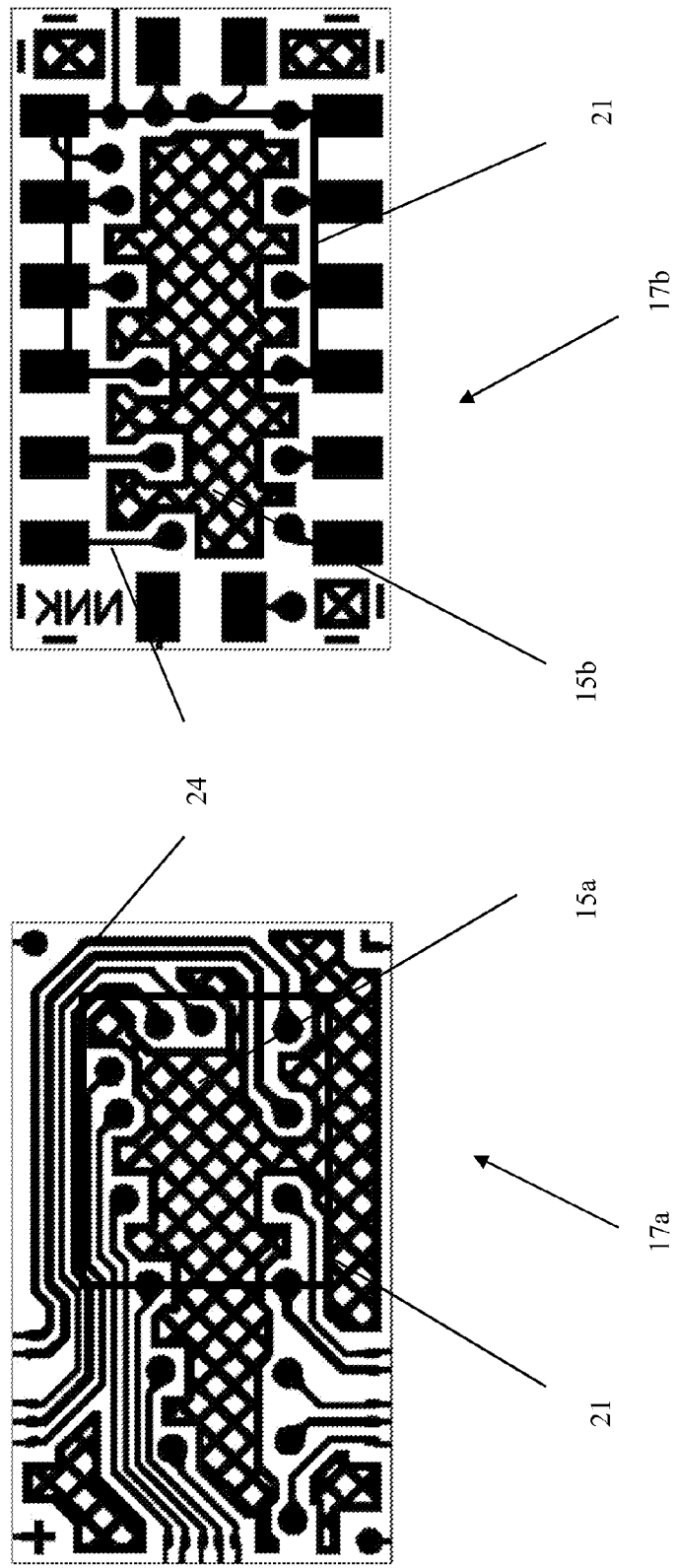
FIGS. 9 to 13 are illustrations of examples of upper and lower metal layer groups including metal support zones according to an embodiment.
Figure 10:
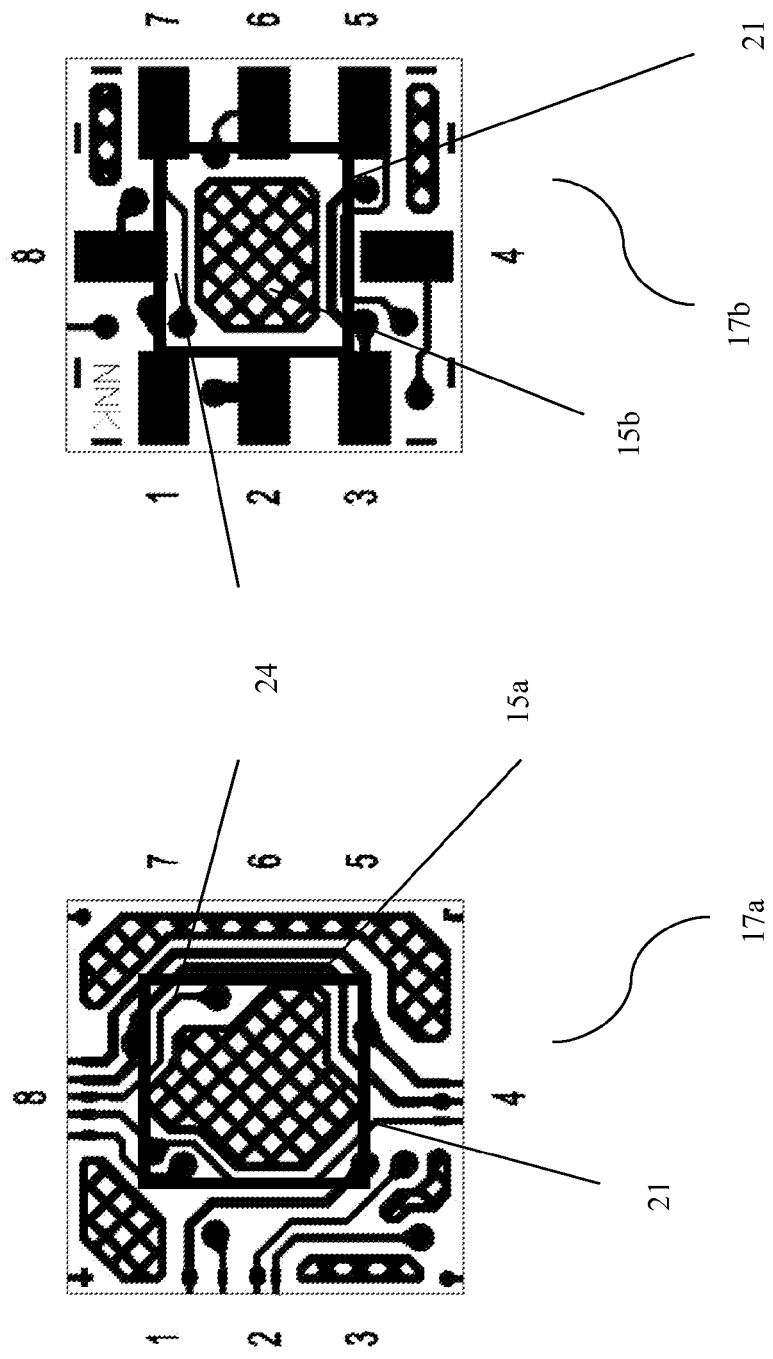
Figure 11:
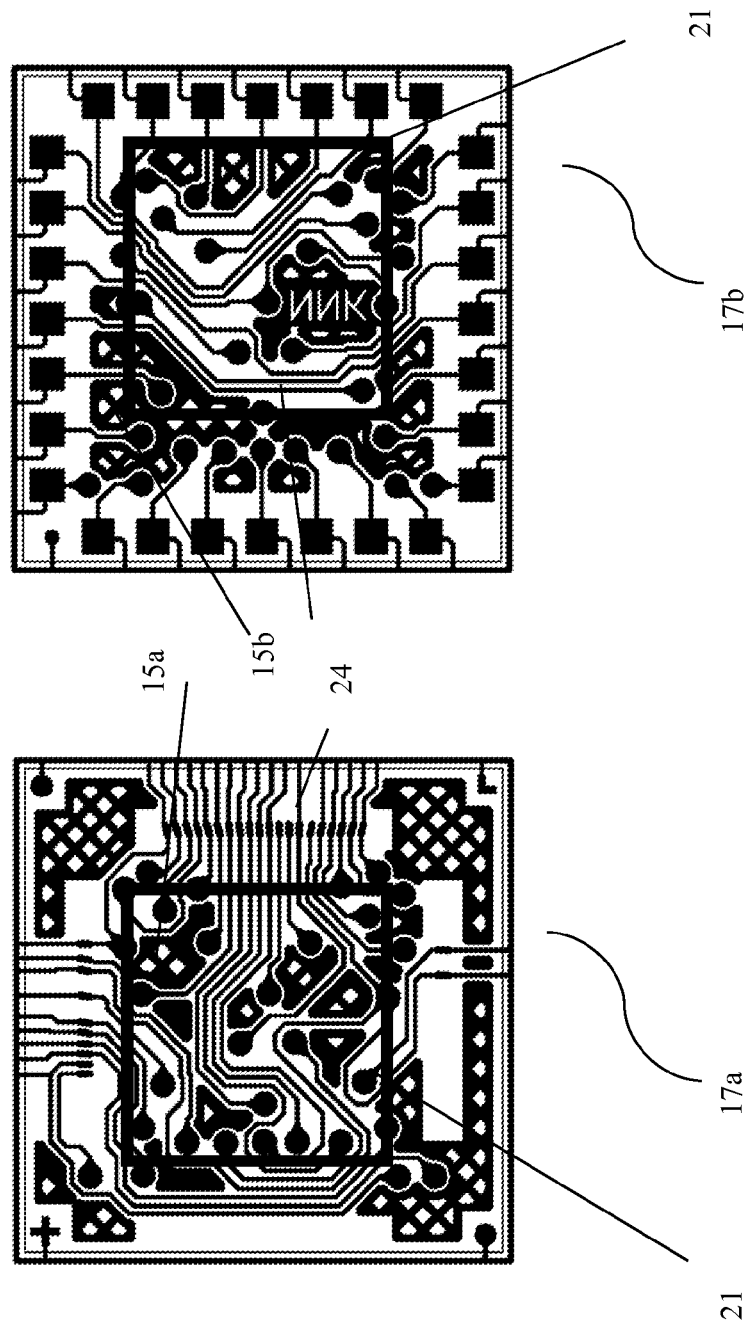
Figure 12:
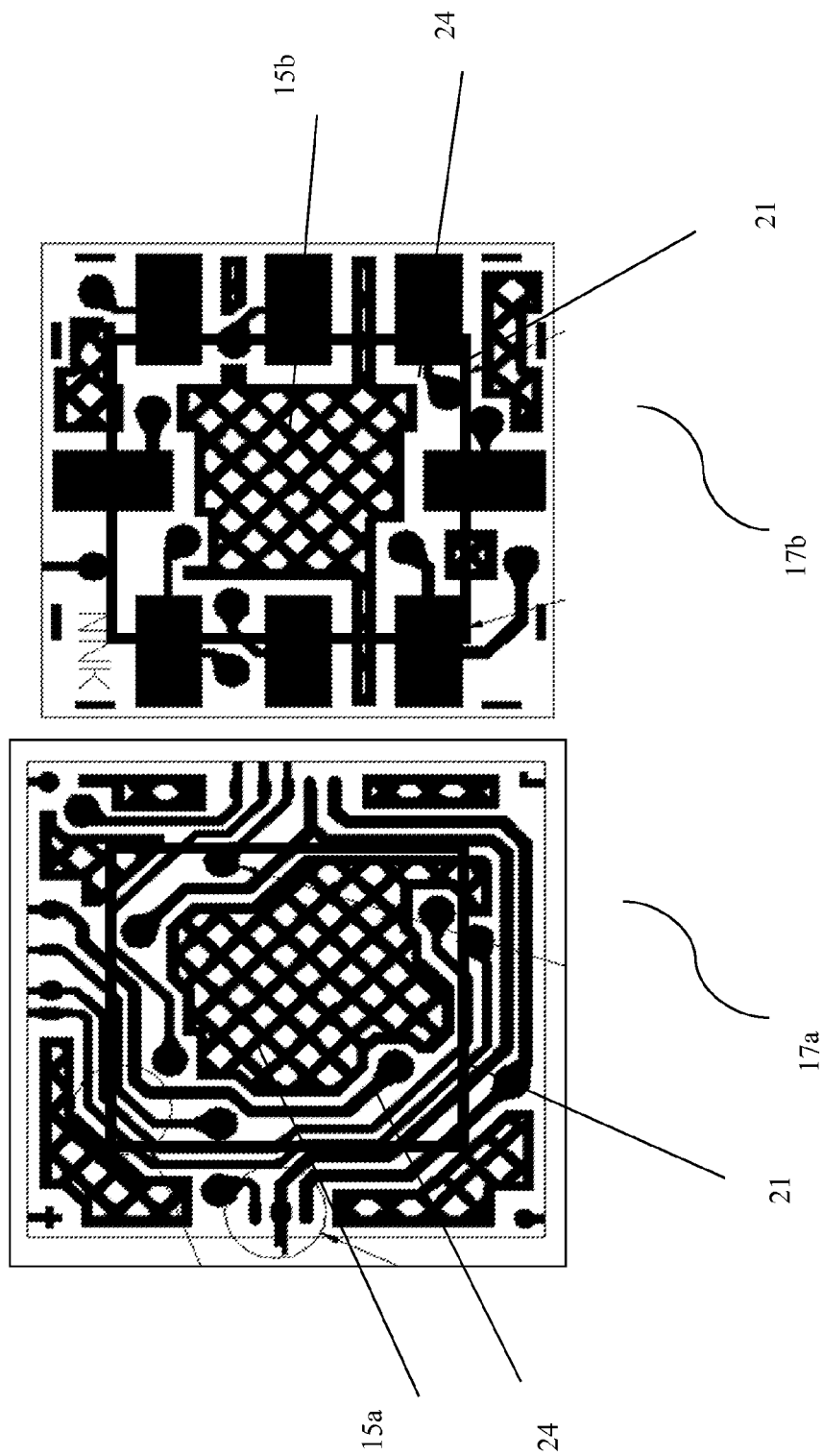

FIGS. 7 and 8 show a MEMS package wherein a metal support copper mesh 15a is positioned so that it only partially supports the overlying damage-sensitive device. FIG. 8 clearly shows tilting of the damage-sensitive device caused by such positioning of the metal support copper mesh 15a.

FIGS. 9 to 12 illustrate examples of package substrates wherein the positioning of metal support copper meshes 15a and 15b in respective metal layers 13a, 13b of metal layer groups 17a and 17b is successful and functioning and which thus satisfactorily support the die 21. Both metal layer groups 17a and 17b exhibit an extensive surface beneath the base 12 of the die consisting of copper mesh-type support metal copper meshes.

The metal support copper meshes 15a, 15b, in fact, are arranged so that, combined, they occupy most of the surface area beneath the base 12 of the damage-sensitive device 21 and at least one of the sides of the base of the damage-sensitive device.

Figure 13:
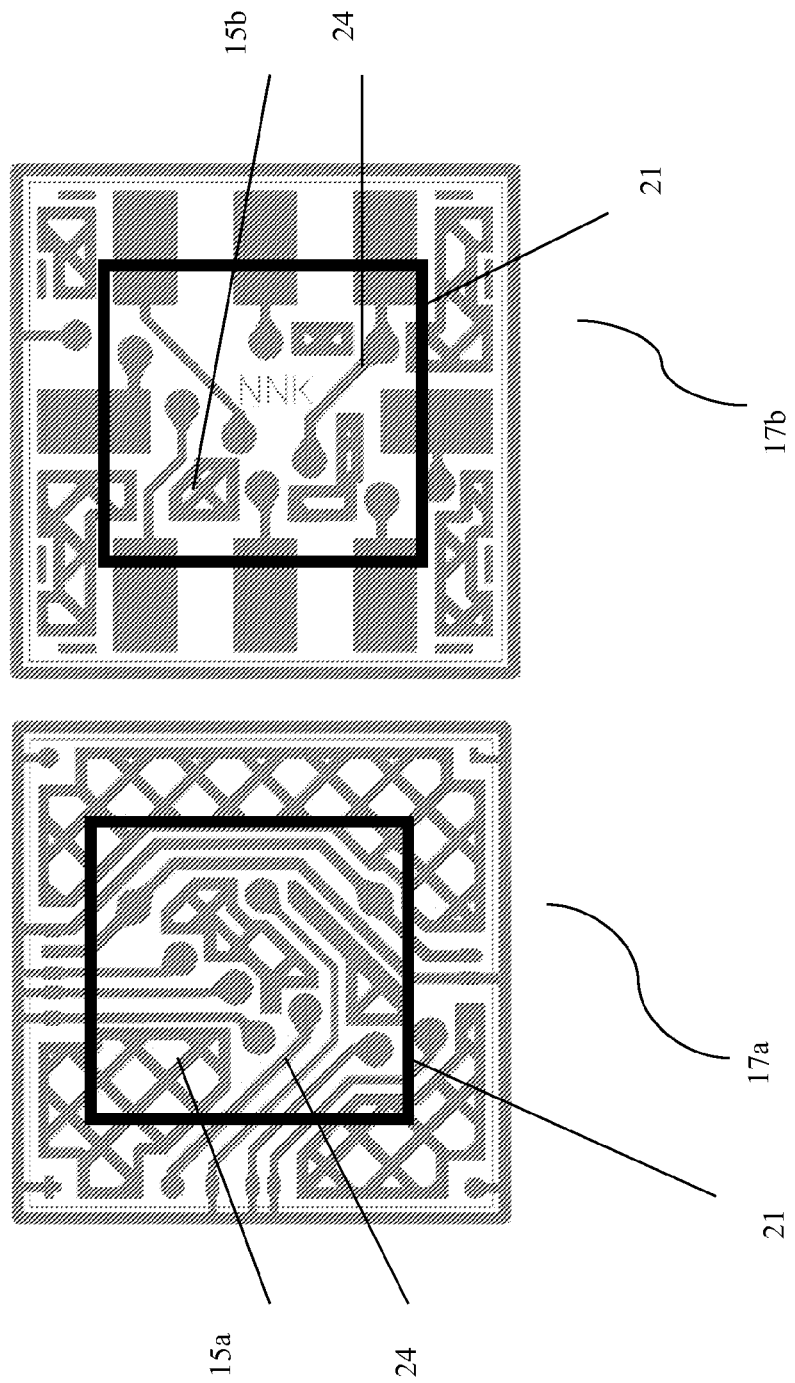

On the contrary, FIG. 13 illustrates an example of package substrate wherein the positioning of the metal support copper meshes 15a and 15b in respective metal layer groups 17a and 17b is unsatisfactory, and would probably cause die glassfrit delamination due to the high assemblage phase stress not being adequately supported and absorbed by the substrate.

In FIG. 13, in fact, metal layer group 17b exhibits hardly any support metal copper meshes at all, and metal group layer 17a does not exhibit a quantity or arrangement of metal support copper meshes that is sufficient for supporting a die. Most of the area beneath the base 12 of the damage-sensitive device, in fact, is not supported.

The outermost metal layers are then covered with one pair of solder mask layers 11a, 11b, one on each of the opposite outermost metal layer surfaces of the at least one pair of metal layers 13a, 13b, again, according to conventional techniques.

Suitable semiconductor devices 21 can be MEMS, ASICs, and in general all devices sensitive to mechanical and thermal stresses, preferably MEMS.

A cap or molding compound 22 encapsulating the semiconductor device 21 is also provided.

It should be also noted that by "substantially", "substantial" and "substantial portion" what is meant here is that the metal support zones 15a, 15b, are arranged in such a way that they occupy a sufficient extent of the area beneath the base 12 of the damage-sensitive device 21 to be of support to the device itself.

Whenever necessary, any combination of the many embodiments described may be used to better meet the specific requirements of the case.

Embodiments also relate to a method for the production and design of a semiconductor package substrate 20 suitable for supporting a damage-sensitive device 21.

According to an embodiment, a package substrate core 14 is provided, having a first or upper and an opposite or lower surface 14a, 14b.

At least one pair of metal layers 13a, 13b is then prepared by forming one or more metal support zones 15a, 15b and routing lines 24 therein. Such metal support zones can consist of metal meshes or die pads, as discussed above. The at least one pair of metal layers 13a, 13b are then deposited on the upper and lower surfaces 14a, 14b of the package substrate core 14 thus defining respectively a first, or upper, metal layer group 17a and an opposite, or lower, metal layer group 17b, both comprising at least one metal layer.

The forming of the support zones 15a, 15b and of the routing lines 24 is carried out according to requirement and according to the preferred arrangement, using methods available and known in the field.

The one or more metal support zones 15a, 15b, are formed in the upper metal layer group 17a, the lower metal layer group 17b, or both, such that the metal support zone 15a, 15b, lies beneath at least one side of the base of the damage-sensitive device 21 and so as to occupy a substantial portion of the area beneath the base 12 of the damage-sensitive device 21 which is free of the routing lines 24.

According to another embodiment, the step of preparing the at least one pair of metal layers 13a, 13b, forms the metal support zone(s) 15a, 15b, so as to occupy a substantial portion of the area beneath the pad area 23 of the damage-sensitive device 21.

According to another embodiment, the step of preparing the at least one pair of metal layers 13a, 13b, forms the metal support zone(s) 15a, 15b so as to occupy a substantial portion of the area beneath at least three sides of the base 12 of said damage-sensitive device 21.

According to another embodiment, the step of preparing the at least one pair of metal layers 13a, 13b, forms at least the upper metal layer group 17a, so that the space beneath the base 12 of the damage-sensitive device 21 which is free of the routing 24 and of the support zone(s) 15a, 15b, does not have an area larger than 0.2 $mm^2$.

Preferably, the step of preparing the at least one pair of metal layers 13a, 13b, forms the upper and lower metal layer groups 17a, 17b, so that the space beneath the base 12 of the damage-sensitive device 21 which is free of the routing 24 and of the support zone(s) 15a, 15b, does not have an area larger than 0.2 $mm^2$.

According to another embodiment 21, the step of preparing the at least one pair of metal layers 13a, 13b, forms said at least one metal support zone 15a, 15b, so that it substantially takes up all the area beneath the base 12 of said damage-sensitive device 21 which is free of routing lines 24.

Figure 2:
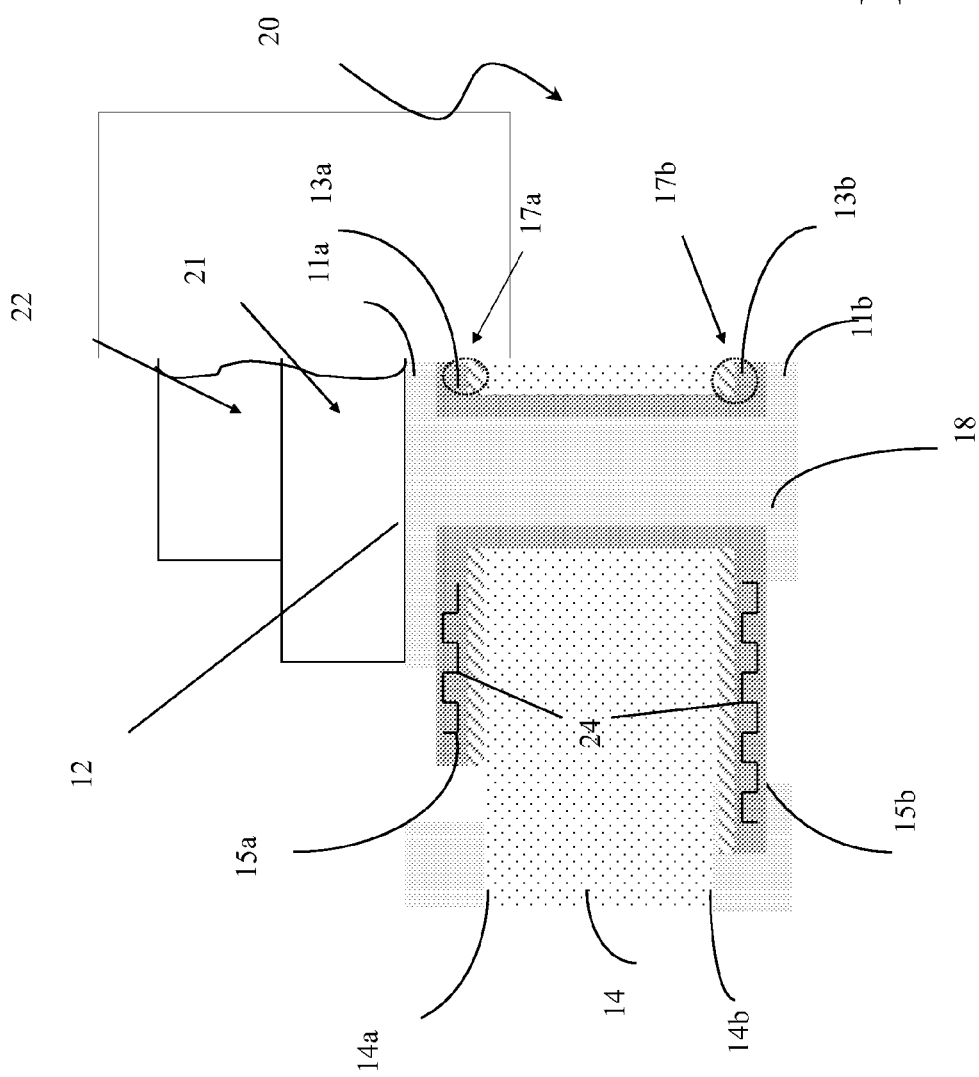
FIG. 2 is a schematic cross section of a package substrate according to an embodiment.

The at least one metal support zone 15a, 15b, is/are formed and arranged as explained above with reference to the device features and in combination with the embodiments shown in FIGS. 2 to 4.

A plurality of vias 18 is then formed through the semiconductor package substrate 20 so that the core 14, and the metal covering layers 13a, 13b are perforated throughout. In particular, the vias 18 are preferably provided as plated through holes, or PTH, but the VIP (vias in pad) technique may also be used, as discussed above.

Then, the solder mask layers 11a, 11b are deposited on the outermost metal layers of the at least one pair of metal layers 13a, 13b of the semiconductor package substrate 20.

A damage-sensitive device 21 is then mounted on top of the upper solder mask layer 11a and wire connections between the package substrate 20 and the damage-sensitive device 21 are carried out.

The semiconductor package comprising the package substrate 20 and the damage-sensitive device 21 is then sealed with the sealant cap 22.

In one example of an embodiment, an LGA/BGA semiconductor package substrate composed of a BT resin core as according to conventional techniques in the field was provided.

The substrate was patterned, first by placing the electric signal traces on both layers of the pair of copper metal layers, in such a way as not to occupy the area directly beneath the MEMS device. In this area beneath the MEMS device were then formed, on both layers, the mesh zones having a pitch of 300 μm and a track width of 100 μm. Finally, the layers were patterned with the openings for the solder mask and the solder mask was applied.

The copper percentage was balanced on the two layers so that the difference in weight was smaller than 5%. To balance any differences, meshes were added where necessary, and therefore also on the lower layer. The upper and lower solder mask layers were also balanced so as to obtain a difference between the two smaller than 5%.

The MEMS device was then mounted on top of the solder mask layer of the upper copper layer surface and wire connections between the substrate and the MEMS device were carried out.

The semiconductor package was then sealed with a sealant cap or molding compound.

It was found that such package gave good functioning performance in the long term in terms of offset stability and drift, given by the fewer cap delamination and loss of sealing effect risks during assembly, in particular during molding. Tilting of die was also successfully prevented.

It is envisaged that semiconductor packages, and therefore the respective positions of the package devices with respect to the IC, can take on any of the configurations known in the field (side by side, stacked, inverse stacking, etc). In such cases, the above description should be modified according to the requirements.

In conclusion, embodiments are improved semiconductor package substrates is capable of better withstanding the mechanical and thermal stresses caused by the assembly steps of the production line.

It has been found, in fact, that by arranging the metal support zones according to patterns of embodiments, the metal layers become well-balanced and mechanically stable and homogeneous.

This way, the package is less exposed to those mechanical and thermal stresses which are damaging to it throughout manufacture and the package can thus withstand the manufacturing assembly steps without suffering from the common problem of delamination of the cap and loss of seal effect.

As well as contributing towards the stress distribution over the copper layers, the metal support zones of embodiments achieve the purpose of controlling the stability and the support characteristics of the substrate following die attachment, thus preventing, in particular, the delamination of the glassfrit between cap and MEMS and tilting of the die.

The result is a package substrate which is suitable to support stress-sensitive devices such as MEMS and the like during assembly and is thus capable of ensuring good performance of the device in the long term.

Package substrates including MEMS devices or other types of semiconductor die may be included in a variety of different types of electronic components, such as bar code scanners, optical displays, computer systems, digital still cameras, digital video cameras, and other types of electronic devices and systems, as will be understood by those skilled in the art.

From the foregoing it will be appreciated that, although specific embodiments have been described herein for purposes of illustration, various modifications may be made without deviating from the spirit and scope of the present disclosure.

What is claimed is:

1. A semiconductor package substrate configured to support a damage-sensitive device having a base and at least one side, the semiconductor package substrate including a package substrate core having a first surface with a first conductive layer formed thereon, the first conductive layer including a first conductive support zone and including a plurality of routing lines for electrically interconnecting the damage-sensitive device to other electronic devices, the first conductive support zone including no routing lines and the first conductive support zone configured so that when the damage-sensitive device is attached to the semiconductor package substrate at least one side of the damage-sensitive device is positioned over the first conductive support zone and a substantial portion of the base of the damage-sensitive device is positioned over the first conductive support zone.

2. The semiconductor package substrate of claim 1 wherein the first conductive layer further comprises a plurality of conductive layers that collectively form a first conductive layer group, the first conductive layer group including the first conductive support zone.

3. The semiconductor package substrate of claim 1 further comprising a second conductive layer formed on a second surface of the package substrate core opposite the first surface, the second conductive layer including a second conductive support zone having no routing lines and the second conductive layer including a plurality of routing lines outside the second conductive support zone.

4. The semiconductor package substrate of claim 1 further comprising a solder mask layer formed on the first conductive layer.

5. The semiconductor package substrate of claim 1 wherein the first conductive support zone is configured so that when the damage-sensitive device is attached to the semiconductor package substrate at least three sides of the base of the damage-sensitive device are positioned over the first conductive support zone.

6. The semiconductor package substrate of claim 1 wherein the first conductive support zone is configured so that when the damage-sensitive device is attached to the semiconductor package substrate the entire base of the damage-sensitive device is positioned over the first conductive support zone.

7. The semiconductor package substrate of claim 1 wherein at least one of the sides the damage-sensitive device positioned over the first conductive support zone includes bonding pads of the damage-sensitive device.

8. The semiconductor package substrate of claim 2 wherein the first conductive layer comprises a metal layer.

9. The semiconductor package substrate of claim 8 wherein the metal layer comprises copper.

10. The semiconductor package substrate of claim 9 wherein the conductive support zone comprises a copper mesh.

11. An electronic system, comprising:
an electronic chip, including,
a damage sensitive device;
a semiconductor package substrate configured supporting the damage-sensitive device and having a base and at least one side, the semiconductor package substrate including a package substrate core having a first surface with a first conductive layer formed thereon, the first conductive layer including a first conductive support zone and including a plurality of routing lines for electrically interconnecting the damage-sensitive device to other electronic devices, the first conductive support zone including no routing lines and the first conductive support zone configured so that when the damage-sensitive device is attached to the semiconductor package substrate at least one side of the damage-sensitive device is positioned over the first conductive support zone and a substantial portion of the base of the damage-sensitive device is positioned over the first conductive support zone.

12. The electronic system of claim 11
wherein the damage-sensitive device comprises a MEMS device.

13. The electronic system of 11 wherein the electronic system comprises one of a bar code scanner, optical displays, computer system, digital still camera, and digital video camera.

14. A semiconductor package substrate configured to support a damage-sensitive device having a base and at least one side, the semiconductor package substrate including a package substrate core having a first surface with a first conductive layer formed thereon, the first conductive layer including a first conductive support zone and including a plurality of routing lines for electrically interconnecting the damage-sensitive device to other electronic devices, the first conductive support zone including no routing lines and the first conductive support zone configured so that when the damage-sensitive device is attached to the semiconductor package substrate a substantial portion of the base of the damage-sensitive device is positioned over the first conductive support zone.

* * * * *